(12) United States Patent
Sukhobok et al.

(10) Patent No.: US 7,260,763 B2
(45) Date of Patent: Aug. 21, 2007

(54) ALGEBRAIC LOW-DENSITY PARITY CHECK CODE DESIGN FOR VARIABLE BLOCK SIZES AND CODE RATES

(75) Inventors: Sergey Sukhobok, Rockville, MD (US); Nina Burns, Columbia, MD (US); Aleksandar Purkovic, Potomac, MD (US)

(73) Assignee: Nortel Networks Limited, St. Laurent, QC (CA)

( * ) Notice: Subject to any disclaimer, the term of this patent is extended or adjusted under 35 U.S.C. 154(b) by 581 days.

(21) Appl. No.: 10/798,110

(22) Filed: Mar. 11, 2004

(65) Prior Publication Data

US 2005/0204253 A1    Sep. 15, 2005

(51) Int. Cl.
*H03M 13/00* (2006.01)
(52) U.S. Cl. ............................... 714/758; 714/804
(58) Field of Classification Search ............... 714/758, 714/804
See application file for complete search history.

(56) References Cited

U.S. PATENT DOCUMENTS 6,633,856 B2 * 10/2003 Richardson et al. ........... 706/15
6,789,227 B2 *  9/2004 De Souza et al. ............. 714/804
6,895,547 B2 *  5/2005 Eleftheriou et al. .......... 714/801

OTHER PUBLICATIONS

R. Echard, et al., *The π-Rotation Low-Density Parity Check Codes*, IEEE publication 0-7803-7206-Sep. 1, 2001, pp. 980-984.
R. Echard, et al., *Irregular π-Rotation LDPC Codes*, IEEE publication 0-7803-7632-Mar. 2, 2002, pp. 1274-1278.
R. Echard, et al., *The Extended Irregular π-Rotation LDPC Codes*, IEEE communications letters, vol. 7, No. 5, May 2003, pp. 230-232.
R. Echard, et al., *Deterministic π-Rotation Low-Density Parity Check Codes*, Electronics Letters, vol. 38, No. 10, May 2002, pp. 464-465.
D. Hocevar, *LDPC Code Construction with Flexible Hardware Implementation*, IEEE publication 0-7803-7802-Apr. 2003, pp. 2708-2712.
H. Zhong, et al., *Design of VLSI Implementation-Oriented LDPC Codes*, (4 pages).
R. Echard, *On the Construction of Some Deterministic Low-Density Parity-Check Codes*, Ph.D. dissertation, 2002, (162 pages).

* cited by examiner

*Primary Examiner*—Guy Lamarre
*Assistant Examiner*—Mujtaba K. Chaudry
(74) *Attorney, Agent, or Firm*—John C. Gorecki

(57) ABSTRACT

A higher code rate Low-Density Parity Check (LDPC) matrix may be designed by concatenating additional matrices to a π-rotation parity check matrix. The concatenated matrix may be selected such that the resultant LDPC matrix exhibits good expansion characteristics to enable the LDPC matrix to be used with variable block length codes. The codes may be designed by generating an ensemble of available codes, encoding them with information vectors of weight 1 and 2 and discarding codes with a low minimum distance. The approximate upper bounds for the remaining codes are then calculated and a small set of codes with the lowest bound under high signal to noise ratio is selected. The girth distributions for the remaining codes are then calculated and the code that has the minimum number of short cycles is selected. The selected code is concatenated to the original π-rotation parity check matrix.

15 Claims, 5 Drawing Sheets

$H = \begin{bmatrix} H^p, H^{d1} \end{bmatrix}$  Parameters $[m; a_1, b_1]$

Figure 5

| | $\pi_A^1$ | $\pi_B^1$ | $\pi_C^1$ | $\pi_D^1$ |
|---|---|---|---|---|
| | $\pi_B^1$ | $\pi_C^1$ | $\pi_D^1$ | $\pi_A^1$ |
| | $\pi_C^1$ | $\pi_D^1$ | $\pi_A^1$ | $\pi_B^1$ |
| | $\pi_D^1$ | $\pi_A^1$ | $\pi_B^1$ | $\pi_C^1$ | a). Code rate 1/2

$H = \begin{bmatrix} H^p, H^{d1}, H^{d2} \end{bmatrix}$  Parameters $[m; a_1, b_1; a_2, b_2]$

Figure 6

| | $\pi_A^1$ | $\pi_B^1$ | $\pi_C^1$ | $\pi_D^1$ | $\pi_A^2$ | $\pi_B^2$ | $\pi_C^2$ | $\pi_D^2$ |
|---|---|---|---|---|---|---|---|---|
| | $\pi_B^1$ | $\pi_C^1$ | $\pi_D^1$ | $\pi_A^1$ | $\pi_B^2$ | $\pi_C^2$ | $\pi_D^2$ | $\pi_A^2$ |
| | $\pi_C^1$ | $\pi_D^1$ | $\pi_A^1$ | $\pi_B^1$ | $\pi_C^2$ | $\pi_D^2$ | $\pi_A^2$ | $\pi_B^2$ |
| | $\pi_D^1$ | $\pi_A^1$ | $\pi_B^1$ | $\pi_C^1$ | $\pi_D^2$ | $\pi_A^2$ | $\pi_B^2$ | $\pi_C^2$ | b). Code rate 2/3

$H = \begin{bmatrix} H^p, H^{d1}, H^{d2}, H^{d3} \end{bmatrix}$  Parameters $[m; a_1, b_1; a_2, b_2; a_3, b_3]$

Figure 7

| | $\pi_A^1$ | $\pi_B^1$ | $\pi_C^1$ | $\pi_D^1$ | $\pi_A^2$ | $\pi_B^2$ | $\pi_C^2$ | $\pi_D^2$ | $\pi_A^3$ | $\pi_B^3$ | $\pi_C^3$ | $\pi_D^3$ |
|---|---|---|---|---|---|---|---|---|---|---|---|---|
| | $\pi_B^1$ | $\pi_C^1$ | $\pi_D^1$ | $\pi_A^1$ | $\pi_B^2$ | $\pi_C^2$ | $\pi_D^2$ | $\pi_A^2$ | $\pi_B^3$ | $\pi_C^3$ | $\pi_D^3$ | $\pi_A^3$ |
| | $\pi_C^1$ | $\pi_D^1$ | $\pi_A^1$ | $\pi_B^1$ | $\pi_C^2$ | $\pi_D^2$ | $\pi_A^2$ | $\pi_B^2$ | $\pi_C^3$ | $\pi_D^3$ | $\pi_A^3$ | $\pi_B^3$ |
| | $\pi_D^1$ | $\pi_A^1$ | $\pi_B^1$ | $\pi_C^1$ | $\pi_D^2$ | $\pi_A^2$ | $\pi_B^2$ | $\pi_C^2$ | $\pi_D^3$ | $\pi_A^3$ | $\pi_B^3$ | $\pi_C^3$ | c). Code rate 3/4

ALGEBRAIC LOW-DENSITY PARITY CHECK CODE DESIGN FOR VARIABLE BLOCK SIZES AND CODE RATES

BACKGROUND OF THE INVENTION

1. Field of the Invention

The present invention relates to communication networks and, more particularly, to algebraic low-density parity check code design for variable block sizes and code rates.

2. Description of the Related Art

Data communication networks may include various computers, servers, nodes, routers, switches, bridges, hubs, proxies, and other network devices coupled to and configured to pass data to one another. These devices will be referred to herein as "network elements." Data is communicated through the data communication network by passing protocol data units, such as Internet Protocol packets, Ethernet Frames, data cells, segments, or other logical associations of bits/bytes of data, between the network elements by utilizing one or more communication links between the devices. A particular protocol data unit may be handled by multiple network elements and cross multiple communication links as it travels between its source and its destination over the network.

In wireless networks, especially wireless local area networks, data transmission may occasionally, or frequently, encounter bit errors. In some instances, the transmission errors may be relatively high. To enable accurate transmission of data under these transmission characteristics, it is common to use forward error correction to enable the data to be extracted from the signal even if the signal is corrupted.

Forward error correction is a technique of adding redundancy (parity check bits) to transmitted information so that received information can be recovered even in the presence of noise. Codes that implement forward error correction have varying degrees of complexity and effectiveness.

Depending on the transmission characteristics of the wireless network and the complexity of the code, fewer or greater numbers of parity check bits may need to be inserted into the data stream. The number of data bits out of the total number of transmitted bits will be referred to herein as the "code rate." For example, if 1000 parity bits are injected for every 1000 bits of data, the code rate=1000/(1000+1000) =½. Similarly, if 500 parity bits are injected for every 1000 bits of data, the code rate=1000/(1000+500) or ⅔. Thus, an increased code rate results in the transmission of fewer parity check bits and hence reduces the overhead associated with transmission on the wireless network. On a transmission medium such as a wireless transmission medium, reducing the transmission overhead directly results in an increase in usable available bandwidth on the network. Thus, optimization of the parity check code to enable higher code rates is one way to increase throughput on a wireless network.

Injection of parity bits into the data stream and the use of these parity bits is controlled by an error correction code, the complexity of which depends greatly on the selection of a parity check matrix "H." As the parity check matrix increases in complexity, the processing required on the end systems increases. Low density parity check matrices contain a large number of zeros, and hence may be expected to be relatively less complicated to implement.

Thus, the two goals of error correction code generation may generally be considered to be to generate a higher code rate while maintaining or reducing the complexity of implementing the code. In pursuit of these dual goals, several parity check codes have been developed, each of which have particular limitations. For example, $\pi$-rotation codes have been developed for a code rate of up to ½. One advantageous aspect of the $\pi$-rotation codes is their relative simplicity to implement in hardware due to the algebraic nature of the technique. Unfortunately, $\pi$-rotation codes have a code rate of $\leq$½, and thus are not relevant for many applications. Other techniques, such as Mutual Orthogonal Latin Rectangles (MOLR) and array codes can be used for rates above ½, but do not perform well for rates below ½. Finite geometry codes exist for high and low rates, but have a structure that is more complex to implement in hardware. Accordingly, it would be advantageous to be able to generate higher rate codes while not increasing the complexity of the codes excessively.

Additionally, different types of transmissions on the wireless network require different block sized transmissions. For example, data transmissions may involve the transmission of a 600-1500 byte block size whereas voice transmissions may involve the transmission of a 100 byte block size. Conventionally, the different block sizes were handled by different sized parity check matrices. This requires the creation and storage of multiple parity check matrices on the network elements for each expected block size.

SUMMARY OF THE INVENTION

The present invention overcomes these and other drawbacks by providing a method and apparatus for algebraic low-density parity check code design for variable block sizes and code rates. According to an embodiment of the invention, the method allows higher code rate parity check matrices to be designed that are algebraic and are fully specified with simple matrix arithmetic. Providing codes that are algebraic enables them to be readily implemented in hardware. Enabling the parity check codes to be used at rates above ½ enables the parity check codes to be used in environments where the $\pi$-rotation technique may not be applicable. Additionally, the parity check code matrix may be easily expandable to enable the parity check code to be used with variable block size transmission schemes.

According to one embodiment of the invention, the $\pi$-rotation construction is modified to include rates above ½. Additionally, the method enables codes to be selected that exhibit good expansion characteristics so that the block length of the codes may be expanded without incurring an excessive corresponding degradation in performance.

According to one embodiment of the invention, initially an ensemble of available codes with a given size permutation matrix are generated. Information vectors of weight 1 and 2 are then encoded using the permutation matrices and the ensemble of codes is reduced by discarding codes with a low minimum distance. The approximate upper bound for all of the remaining candidate codes is then calculated and a small set of codes with the lowest bound under high signal to noise ratio is selected. The girth distributions for the remaining codes are then calculated and the code that has the minimum number of short cycles is selected. The girth of a graph is defined as the smallest cycle length that exists in the graph. The new code is then used to create another sub-matrix that is concatenated to an original $\pi$-rotation parity check matrix. This process may be iterated concatenating additional matrix until a parity check code of sufficiently high code rate is obtained.

BRIEF DESCRIPTION OF THE DRAWINGS

Aspects of the present invention are pointed out with particularity in the appended claims. The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures:

DETAILED DESCRIPTION

The following detailed description sets forth numerous specific details to provide a thorough understanding of the invention. However, those skilled in the art will appreciate that the invention may be practiced without these specific details. In other instances, well-known methods, procedures, components, protocols, algorithms, and circuits have not been described in detail so as not to obscure the invention.

According to an embodiment of the invention, the $\pi$-rotation parity check codes are used as a basis for creating higher rate codes that retain the algebraic nature of the $\pi$-rotation parity check codes. This allows the new codes to be readily implemented in hardware because of the algebraic nature of their design.

The $\pi$-rotation technique is described in detail in a paper by R. Echart, "*The $\pi$-Rotation Low-Density Parity Check Codes*," Proc. GLOBECIM 2001, pp. 980-984, November 2001, the content of which is hereby incorporated herein by reference. In the $\pi$-rotation technique, the parity check matrix H of the code has the partitioned form $H=[H^p|H^d]$. The parity bit positions in the codeword correspond to the columns of $H^p$ and the information bit positions correspond to the columns of $H^d$.

The $H^p$ sub-matrix in the $\pi$-rotation technique is a square, dual-diagonal matrix. This has the effect of significantly reducing the encoding complexity by avoiding Gaussian elimination during the encoding process. A simple back-substitution can be used to calculate the parity bits from the information bits starting with the bottom row of H. The codewords are then in canonic systematic form. An example of the $H^p$ sub-matrix is shown below.

$$H^p = \begin{bmatrix} 1 & 1 & 0 & 0 & 0 & 0 \\ 0 & 1 & 1 & 0 & 0 & 0 \\ 0 & 0 & 1 & 1 & 0 & 0 \\ 0 & 0 & 0 & 1 & 1 & 0 \\ 0 & 0 & 0 & 0 & 1 & 1 \\ 0 & 0 & 0 & 0 & 0 & 1 \end{bmatrix}$$

The $H^d$ sub-matrix is specified via a single permutation matrix. The $H^d$ sub-matrix is composed of the four rotational orientations of the permutation matrix. Specifically, the $H^d$ sub-matrix contains of a j×k array of m×m permutation matrices. There are several conventional methods to create a permutation matrix, such as an array code method, Lattice-Based Construction method, and the MOLR method. One such method will be described briefly below. Additional information on this technique may be obtained from R. Echart, "*On the Construction of Some Deterministic Low-Density Parity Check Codes*," PhD dissertation, George Mason Univ., Fairfax, Va., 2002, the content of which is hereby incorporated herein by reference.

In this technique, the original permutation matrix is defined by a vector which has three parameters [m,a,b]. The parameters (a,b) are used to create a permutation vector of length m identifying non-zero elements in each column, counting from the bottom (or from the top). Each row and each column contains exactly one non-zero element. The following algorithm may be used to create the permutation matrix:

$S=\{s_0, s_1, \ldots, s_{m-1}\}$, where $s_0=0$, $s_1=1 \ldots, s_{m-1}=m-1$.
l=m
for $j_1=1:m$
    $i=(a*j_1+b)\mod(m+1-j_1)$
    $\pi_A(j_1)=m-s_i$
    for $j_2=1:l-1$
        $s_{j2}=s_{j2+1}$
    next $j_2$
    l=l-1
next $j_1$ Once a single permutation matrix $\pi_A$ has been created, it is straightforward to create four rotational orientations of $\pi_A$ as shown below. The three 90 degree counterclockwise rotations of $\pi_A$, are labeled herein as $\pi_B$, $\pi_C$ and $\pi_D$. For example, using the parameters vector[m=6,b=5, a=3], the permutation vector [4 2 3 1 6 5] may be calculated. From this vector, the following matrices may be created:

$$\pi_A = \begin{bmatrix} 0 & 0 & 0 & 0 & 1 & 0 \\ 0 & 0 & 0 & 0 & 0 & 1 \\ 1 & 0 & 0 & 0 & 0 & 0 \\ 0 & 0 & 1 & 0 & 0 & 0 \\ 0 & 1 & 0 & 0 & 0 & 0 \\ 0 & 0 & 0 & 1 & 0 & 0 \end{bmatrix} \quad \pi_D = \begin{bmatrix} 0 & 0 & 0 & 1 & 0 & 0 \\ 0 & 1 & 0 & 0 & 0 & 0 \\ 0 & 0 & 1 & 0 & 0 & 0 \\ 1 & 0 & 0 & 0 & 0 & 0 \\ 0 & 0 & 0 & 0 & 0 & 1 \\ 0 & 0 & 0 & 0 & 1 & 0 \end{bmatrix} \quad (0.1)$$

$$\pi_B = \begin{bmatrix} 0 & 1 & 0 & 0 & 0 & 0 \\ 1 & 0 & 0 & 0 & 0 & 0 \\ 0 & 0 & 0 & 0 & 0 & 1 \\ 0 & 0 & 0 & 1 & 0 & 0 \\ 0 & 0 & 0 & 0 & 1 & 0 \\ 0 & 0 & 1 & 0 & 0 & 0 \end{bmatrix} \quad \pi_C = \begin{bmatrix} 0 & 0 & 1 & 0 & 0 & 0 \\ 0 & 0 & 0 & 0 & 1 & 0 \\ 0 & 0 & 0 & 1 & 0 & 0 \\ 0 & 0 & 0 & 0 & 0 & 1 \\ 1 & 0 & 0 & 0 & 0 & 0 \\ 0 & 1 & 0 & 0 & 0 & 0 \end{bmatrix}$$

Combining the dual-diagonal matrix and the four rotational orientations of $\pi_A$ as shown below, results in the classic π-rotation parity check matrix. The matrix $H^d$ is obtained by cyclically shifting the permutation matrices of the first row left one position for each successive row as illustrated below. The created code has a rate of one-half and codeword length 8 m.

$$H = \begin{bmatrix} 1 & 1 & 0 & 0 & \pi_A & \pi_B & \pi_C & \pi_D \\ 0 & 1 & 1 & 0 & \pi_B & \pi_C & \pi_D & \pi_A \\ \ldots & & & & \pi_C & \pi_D & \pi_A & \pi_B \\ 0 & 0 & 0 & 1 & \pi_D & \pi_A & \pi_B & \pi_C \end{bmatrix}$$

One advantage of this technique is that an efficient encoding is achieved directly from the parity check matrix H without the need to apply a Gaussian elimination, as would be the case with a randomly generated parity check matrix.

Construction of High-Rate (>½) LDPC Codes Based on the Rotation Technique

The π-rotation technique creates codes that achieve good performance and have efficient hardware implementation for parity check matrices that describe codes with rates ≦½. Applicants have found that the π-rotation technique may be adapted to construct sub-matrices that may be concatenated to the original π-rotation parity check matrix to construct high-rate (rates >½) LDPC codes. The technique may be used to construct codes for various block lengths and code rates that can be implemented with a single instantiation of a parity check matrix.

Figure 2:
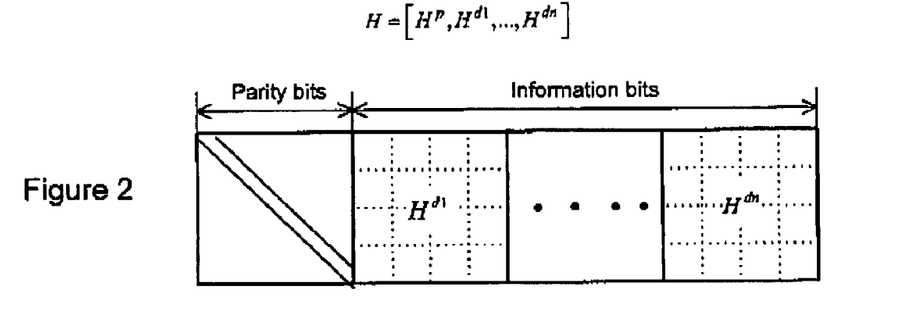
FIG. 2 is a graphical representation of a parity check matrix according to an embodiment of the invention.

The generic structure of a concatenated π-rotation based LDPC code created according to an embodiment of the invention is shown in FIG. 2. As shown in FIG. 2, the parity check matrix can be specified in terms of the square 4 m×4 m sub-matrices $H^{di}$, i=1,2, . . . ,n. The architecture of the block structured parity check matrix is based on the π-rotation technique, which renders an efficient method for constructing codes with a reduced number of short cycles and reasonable distance properties.

Each $H^{di}$, i=1,2, . . . ,n sub-matrix is constructed from the four rotational orientations of the single permutation matrix as shown above. According to an embodiment of the invention, codes with relatively large girth characteristics and good minimum distance profiles are selected to obtain codes having relatively good performance. In order to achieve this goal the parity check matrix is constructed by concatenating sub-matrices that meet particular criteria to generate an acceptable performance. Specifically, each sub-matrix is chosen based on the minimum distance profile and the minimum number of short cycles to allow an acceptable girth and distance profile to be obtained.

Figure 3:
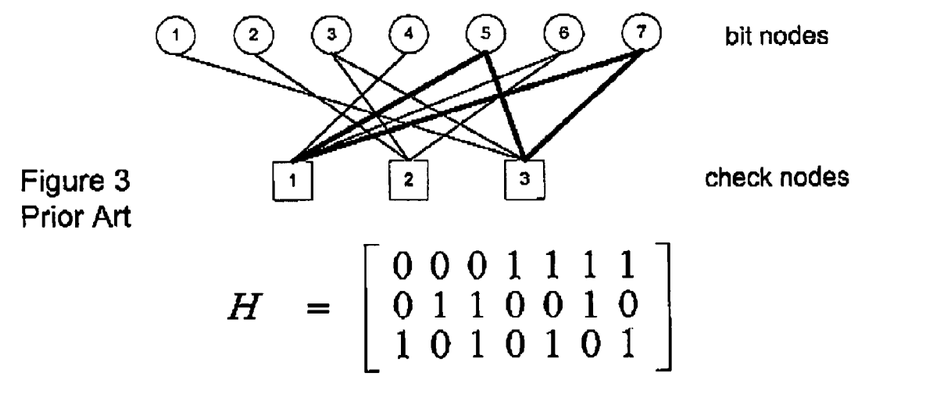
FIG. 3 is a bipartite graphical representation of an example of a low density parity check code.

The girth of a graph is defined as the smallest cycle length that exists in the graph. FIG. 3 illustrates an example of a cycle in a bipartite graph representation of an LDPC code. In this figure, bold lines represent a cycle of the length 4. The girth distribution of a parity check code will generally be specified by the number of cycles in the code that have particular lengths, which may be represented by a histogram. The histogram presents the distribution of the girth i.e. how many cycles of particular length exist in the graph. The "distance" between two codewords is the number of bit positions in which the codewords differ (Hamming distance). Codes that have larger minimum distance generally have better performance.

The search procedure is used to find an ensemble of codes with good distance characteristics. Although finding the exact minimum distance of a code is difficult especially for large block lengths, an approximation using a sub-optimum search algorithm can be used to estimate the minimum distance. It has been shown that in the case when the parity check matrix has a dual diagonal pattern, the lowest weight codeword is most likely generated from an information vector of weight 2. In one embodiment of the invention, the process implements a search to find a set of codes with a good minimum distance profile.

For example, initially, starting with a single permutation matrix of the size m×m, a ½ rate classic π-rotation parity check matrix is created. Considering that the code is specified with only three parameters [m,a,b], a search procedure is applied to select parameters (a,b) that generate the acceptable minimum distance profile and the minimum number of short cycles. The corresponding set of pairs (a,b) is obtained by generating codewords using information vectors of weight 1 and 2. Using this method, it is possible to generate all codewords with an information vector of weight 2 even for relatively large block lengths.

Next, an ensemble of good codes is obtained by discarding the codes with low minimum weight. It is well known that the performance of LDPC codes at very high signal to noise ratio (SNR) (higher than operational SNR range) depends on low-weight codewords. However, applicants have observed that errors at such high SNR relate to minimum distance errors. This observation leads us to calculate the approximated upper bound as:

$$P_{b,bound} = (W_{free}/K) * Q\left(\sqrt{2d_{\min}R\frac{E_b}{N_0}}\right) \quad \text{Equation (1)}$$

Where $W_{free}$ is the sum of weights of all information frames of length K generating codewords with minimum distance $d_{min}$, R is the code rate, $E_b$ is the energy per information bit, and $N_0$ is the noise one-sided power spectral density.

The next step is to reduce the number of codes in this ensemble by eliminating the codes with higher upper bounds. The reason for this step is that the performance of the code depends not only on the minimum distance, but also on the number of codewords with that weight.

Once the ensemble of the best candidates is created it is possible to proceed with a calculation of the girth. The girth of a graph is defined as the smallest cycle length that exists in the graph. For each code-candidate, the software calculates the girth at each node and then the average over all nodes, called the girth average. A brief explanation of girth is provided above. According to one embodiment of the invention, the code with the smallest number of short cycles is selected for inclusion in the parity check code. The invention is not limited to this embodiment, however, as other selection criteria may be employed as well such as the lowest average girth, the lowest mean girth, or another selection criteria.

Figure 4:
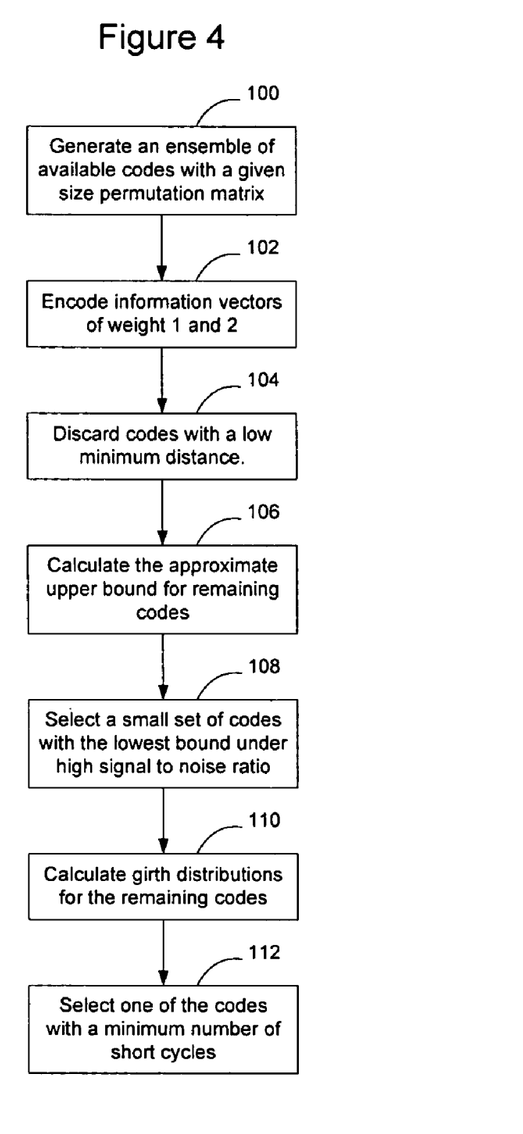
FIG. 4 is a flow chart illustrating a process of generating parity check codes according to an embodiment of the invention.

FIG. 4 illustrates a process of selecting codes according to an embodiment of the invention. As shown in FIG. 4, initially, an ensemble of available codes with a given size permutation matrix are generated (100). Then, information vectors of weight 1 and 2 are encoded (102) and the ensemble of codes is reduced by discarding codes with a low minimum distance (104). The approximate upper bound for all of the remaining candidate codes is then calculated (106) and a small set of codes with the lowest bound under high signal to noise ratio is selected (108). The girth distributions for the remaining codes are then calculated (110) and the code that has the minimum number of short cycles is selected (112). The new code is then used to create another sub-matrix that is concatenated to the original π-rotation parity check matrix as shown in FIG. 2. This new π-rotation parity check matrix will have a code rate equal to x/x+1, where x is the number of sub-matrices that have been concatenated using this process. Where higher rate codes are desired, the process may iterate taking into account the parameters that have been determined during earlier iterations.

Figure 5:
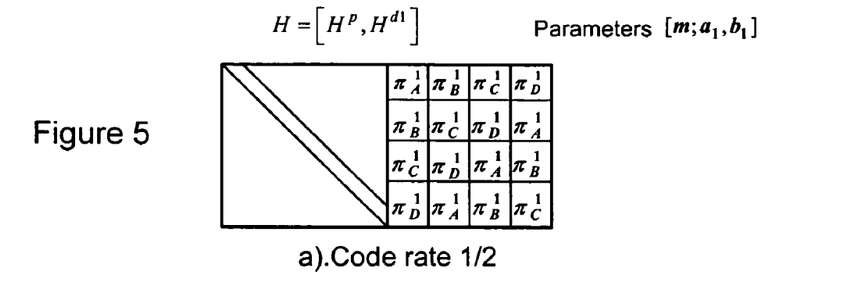
FIGS. 5-7 illustrate successive iterations of a parity check matrix in connection with designing a ¾ rate parity check code.
Figure 6:
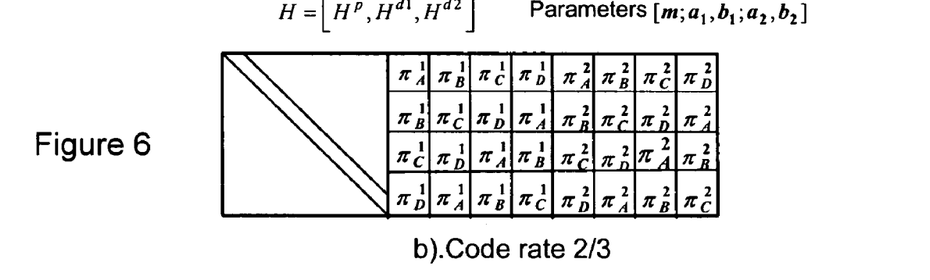
Figure 7:
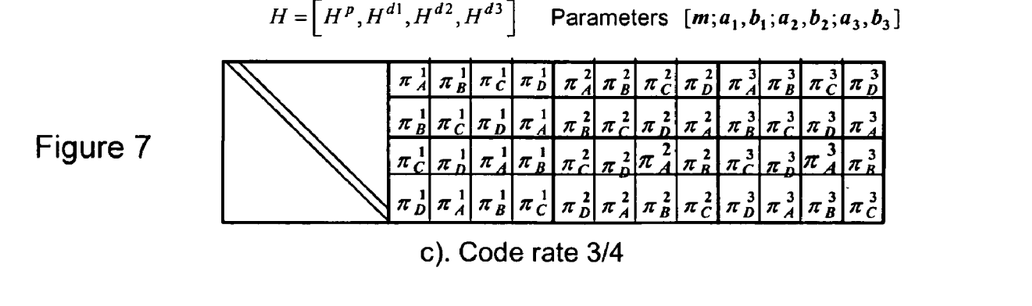

An example of constructing a ¾ rate LDPC code is shown in FIGS. 5-7. As shown in FIG. 5, initially a parity check matrix with a code rate of ½ is formed using a conventional π-rotation technique. Subsequently, as shown in FIG. 6, the process described above is used to generate another matrix that is then concatenated onto the original parity check matrix. The concatenated matrix includes the original parity check matrix and the portion of the matrix derived using this process. The code rate for the resultant new parity check matrix is ⅔. The process described above is then iterated using the parameters reflected in the parity check matrix of FIG. 6 to create a new matrix which is concatenated to the parity check matrix to create the new parity check matrix illustrated in FIG. 7. The resultant code rate of the created parity check matrix is ¾. This process may be iterated to obtain parity check matrices having other desired higher code rates as well.

Parity Check Matrix Expansion

As mentioned above, different types of transmission may require different transmission block lengths. To accommodate this, according to an embodiment of the invention, expansion of the matrix is considered in the selection process to enable a parity check matrix to be created that exhibits good expansion characteristics over the range of expected block lengths. Thus, according to this embodiment of the invention, the original parity check matrix can be used to provide a base for defining a family of LDPC codes that can be implemented with a single programmable decoder.

To enable an understanding of how expansion works in a LDPC code, a generalized discussion of expansion will be provided. The invention is not limited to this particular expansion method. Specifically, there are presently only a few methods that describe an expansion of the parity check matrix. For example, one description of an available method is disclosed in an article by H. Zhong, et al., entitled "*Design of VLSI Implementation-Oriented LDPC codes*," and published at IEEE Semiannual Vehicular Technology Conference (VTC), October 2003. Another description of an available method is disclosed in an article by D. Hocevar, entitled "*LDPC code Construction with Flexible Hardware Implementation*," and published in IEEE International Conference on Communications, Volume: 4, 2003. The content of each of these articles is hereby incorporated herein by reference. Both methods are similar and will be summarized below. Additional details may be found in the above-referenced papers. The expansion methodology generally consists of two parts: (1) generation of an M×N base parity check matrix; and (2) expansion of the base matrix.

Generation of the M×N Base Parity Check Matrix

An irregular LDPC code construction is often used to generate the base matrix. The term 'irregular' LDPC matrix refers to a matrix where row and column weights vary. There are several methods for creating an irregular code, but the general idea is to have a large girth of the Tanner graph that is associated with the matrix. The detailed description of the bit-filling algorithm can be found in the paper by H. Zhong, et al., mentioned above. An example of a base parity check matrix is illustrated below:

$$H = \begin{bmatrix} 1 & 0 & 1 & 0 & 1 & 0 & 0 & 0 \\ 0 & 0 & 0 & 1 & 0 & 0 & 0 & 1 \\ 0 & 1 & 0 & 0 & 1 & 0 & 1 & 0 \\ 1 & 0 & 1 & 0 & 0 & 1 & 0 & 0 \end{bmatrix}$$

Expansion of the Parity Check Matrix

Once the base matrix is found, the base matrix is expanded by replacing each 0 in the base matrix with an L×L matrix of zeros and each 1 in the base matrix is replaced with a shifted identity matrix ($h_{i,j}$). For example, the following is an identity matrix shifted by 1 to the right:

$$h_{i,j} = \begin{bmatrix} 0 & 1 & 0 & 0 \\ 0 & 0 & 1 & 0 \\ 0 & 0 & 0 & 1 \\ 1 & 0 & 0 & 0 \end{bmatrix}$$

The resulting matrix is an M×L matrix containing the expanded submatrices. The following matrix is an example expanded base parity check matrix:

| $h_{1,1}$ | 0 | $h_{1,3}$ | 0 | $h_{2,5}$ | 0 | 0 | 0 |
|---|---|---|---|---|---|---|---|
| 0 | 0 | 0 | $h_{2,4}$ | 0 | 0 | 0 | $h_{2,8}$ |
| 0 | $h_{3,2}$ | 0 | 0 | $h_{3,5}$ | 0 | $h_{3,7}$ | 0 |
| $h_{4,1}$ | 0 | $h_{4,3}$ | 0 | 0 | $h_{4,6}$ | 0 | 0 |

M × L

N = (K + M) × L

The expansion factor L is equal to the size of the identity matrix used in the expansion process. The main difference between the methods discussed in the two papers mentioned above is in the construction of the permutation matrix.

The main idea of the construction technique developed by Sridhara, Fuja and Tanner is to use an identity matrix of the size L×L, where L is a prime number. The rows of the identity matrix are then circularly shifted by the value that can be calculated with the following expression:

$$\text{Shift} = b^s a^t \bmod L,\ 0 \leq s < M,\ 0 \leq t < N$$

where M and N are the number of rows and columns of the matrix, the pair (s,t) is the current location of the identity matrix being shifted, generators (a,b) have multiplicative order of M and N, that is, $a^N = 1 \bmod L$ and $b^M = 1 \bmod L$.

H. Zhong, by contrast, uses an approach based on a randomly generated shift value. The first step in this method is to generate an ensemble of codes with randomly generated permutation matrices. The code selection criteria are based on the estimation of the number of short cycles in the bipartite graph. The best code within the ensemble is the code that has the smallest number of the short cycles.

The main advantage of the expansion algorithm presented in these techniques is that it may be efficiently implemented in hardware in a decoder. There is a potential problem, however, when expanding the base matrix by multiple expansion factors≦L. Specifically, there is no guarantee that the performance of the code for any expansion factor L will be acceptable. In other words, two base matrices of the same size, that have the same minimum distance profile, can have a significantly different performance for their expanded set of codes.

According to an embodiment of the invention, the search method described above may be modified to select an optimal base matrix that has acceptable performance for the range of expanded codes specified by the expansion factors.

Figure 8:
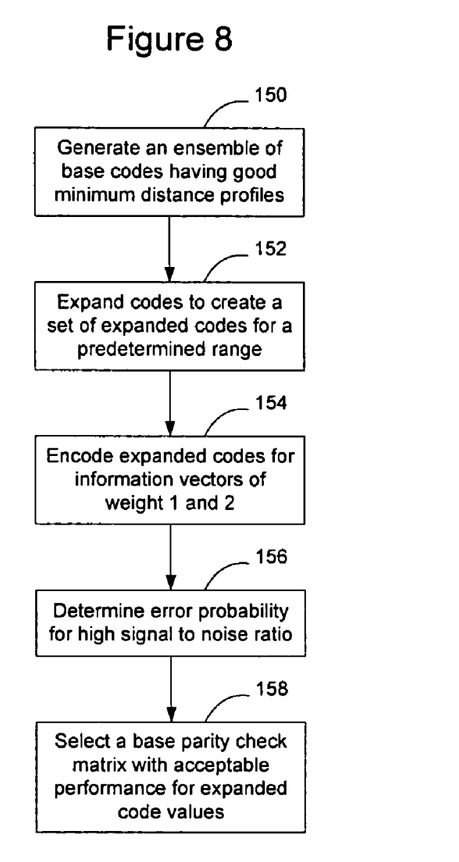
FIG. 8 is a flow chart illustrating a process of generating parity check codes exhibiting advantageous expansion properties according to an embodiment of the invention.

FIG. 8 illustrates an embodiment of the invention in which a base matrix is selected that will yield acceptable performance over the range of expansion factors expected to be used to encode transmission blocks on the network. As shown in FIG. 8, an ensemble of base codes having good minimum distance profiles are initially created using the base code creation process described above (150). These codes are then expanded to create a set of expanded codes for a given range of L (152). The expanded codes are encoded for information vectors of weight 1 and 2 (154) and the error probability bound for a single signal to noise value is calculated using equation (1) described above (156). The signal to noise ratio should be high to guarantee a minimum distance error. Once this has been done, a base parity check matrix with acceptable performance for all expanded codes is selected (158).

Additionally, according to anembodiment of the invention, a new method is used to specify the shift of the identity matrix to reduce hardware complexity. Specifically, according to this embodiment of the invention, the rows of the identity matrix are cyclically shifted by the value that is calculated with the following equation:

$$\text{Shift} = (N_i M_j) \bmod L, \ 0 \leq i < N, \ 0 \leq j < M$$

where $N_i$, $M_j$ is a non-zero entry in the base matrix to be expanded and L is the expansion factor. The invention is not limited to this embodiment, however, as there are other possible ways of calculating the shift value. Compared with the approach presented by H. Zhong, et al., where the permutation matrix is obtained randomly, this method presents a completely deterministic construction of the parity check matrix. Additionally, this new method does not limit expansion to use of an expansion factor that is a prime number, unlike the SFT method disclosed by D. Hocevar, and thus presents more flexibility in choosing the block length.

Figure 9:
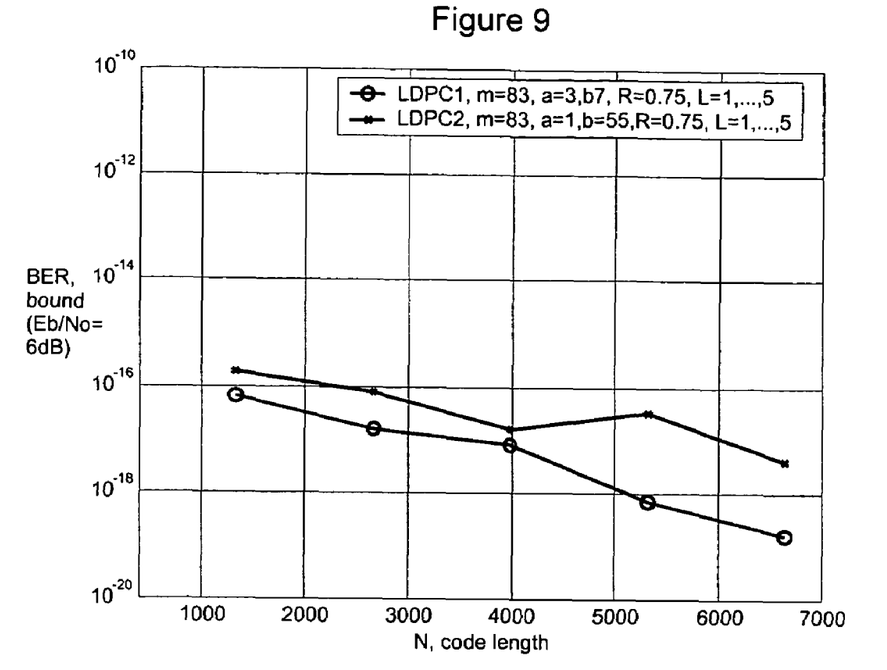
FIG. 9 is a graph of the approximate upper bound on expanded LDPC codes for a selected range of block lengths.

FIG. 9 shows an example of the approximate upper bound on the two best candidate codes of the expanded LDPC codes for a selected range of block lengths. In FIG. 9, maximum expansion factor is 5, but it can be made as large as necessary and practical. The zigzag pattern shows that in order to achieve an acceptable performance for the expected expansion ranges, the search procedure must be applied to choose the best base matrix.

Figure 10:
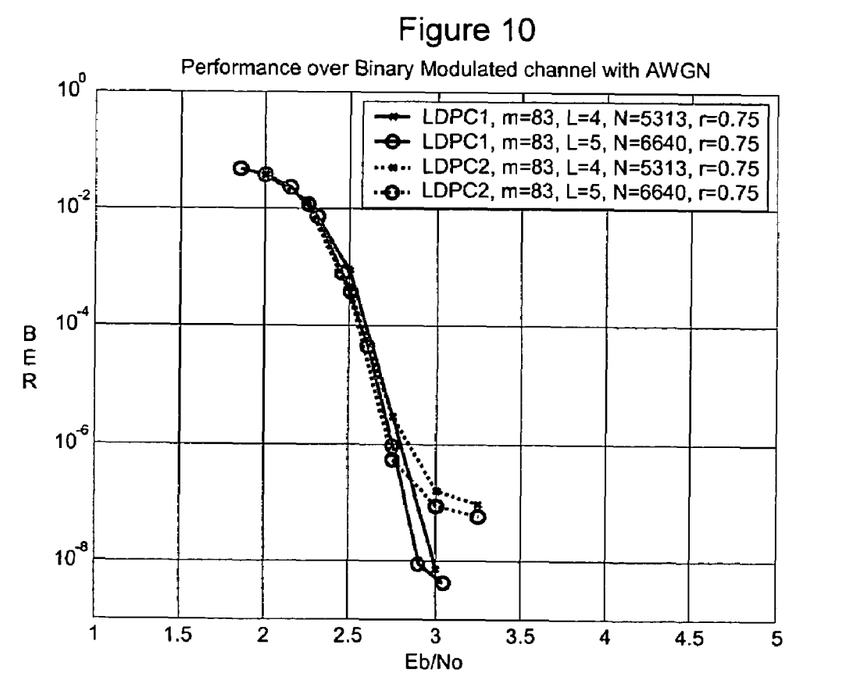
FIG. 10 is a graph of the bit error rate for two sets of codes.

FIG. 10 compares the bit error rate for the two candidate codes shown in FIG. 9. The simulation result, where the LDPC1 code outperformed the LDPC2 code, confirms the improved performance of the chosen code based on the proposed algorithm.

In the above discussion, a method of creating parity check codes for use in a wireless LAN environment was discussed. These codes will work equally well in other types of network configurations as well and the invention is not limited to a wireless network implementation. In a wireless network context, the wireless network elements may communicate using one or more wireless technologies. Several examples of existing wireless technologies include the 802.11x transmission protocols defined by the Institute of Electrical and Electronics Engineers (IEEE) such as 802.11a, 802.11b, or 802.11 g, one of the IEEE 802.16 or 802.18 protocols, a cellular protocol such as the Universal Mobile Telecommunication System (UMTS) wireless communications protocol, HiperLAN, Bluetooth, or another communication protocol. Additionally, although the invention may be implemented in a wireless network, the invention is not limited in this regard as the invention may be used more broadly with other types of communication technology, such as wireline, infra red, acoustic, and numerous other types of communication technologies.

Figure 11:
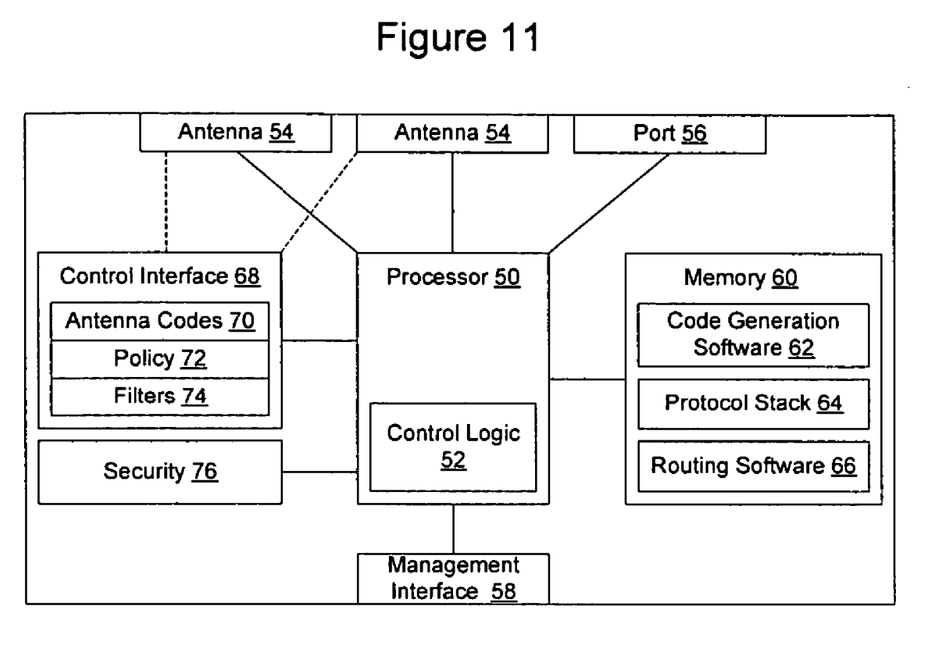
FIG. 11 is a functional block diagram of an example network element configured to generate and use an LDPC code according to an embodiment of the invention.

FIG. 11 is a functional block diagram of a network element configured to implement an embodiment of the invention. The embodiment illustrated in FIG. 11 is a wireless network element having wireless antennae configured to enable the network element to communicate using one or more wireless protocols. The invention is not limited to this embodiment as a wireline device may be used as well. Additionally, a general purpose computer could be used to generate the codes for use with a network element to enable the network element to communicate using the codes. Accordingly, the invention is not limited to the embodiment illustrated in FIG. 11.

Figure 1:
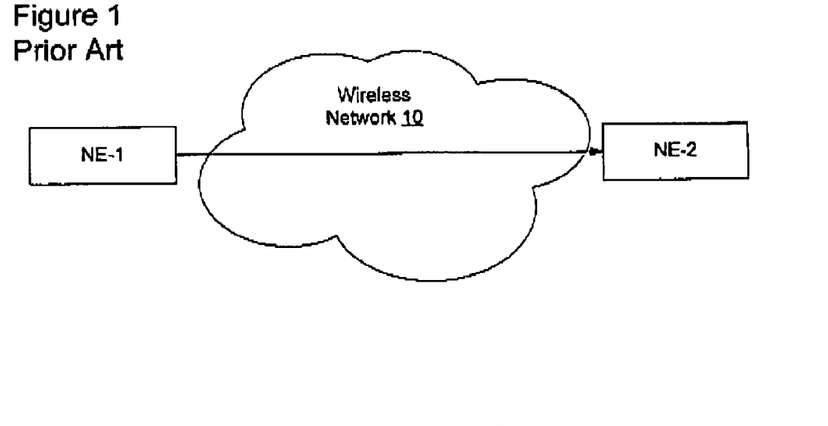
FIG. 1 is a functional block diagram or a portion of an example wireless communication network.

In the embodiment illustrated in FIG. 11, the network element includes a processor 50 containing control logic 52 configured to perform functions described to enable the network element to engage in communications on a communication network, such as the communication network illustrated in FIG. 1. The network element also includes one or more antennae 54 to enable the network element to receive and generate wireless signals. The antennae may be configured to transmit at one or more frequencies and may be configured to operate according to one or more protocols. The invention is not limited to a particular frequency or communication protocol as discussed above.

One or more ports 56 may be provided to enable the network element to also communicate over a wireline or other type of network. Optionally, one or more management interfaces 58 may be provided on the network element, and associated with a dedicated management port or logically configured on one or more of the antennas 54 and ports 56 to enable the network element to be controlled by an appropriate management entity.

A memory 60 may be provided to maintain information for use by the processor 50 to enable the network element to operate on the network. For example, in an embodiment where the network element is configured to determine its own codes for use on the network, the memory may contain code generation software 62 to enable the network element to design algebraic low-density parity check codes for variable block sizes and code rates. Where these codes are to be provided to the network element from an external network element or computer, they may be transmitted to the network element over the management interface 58 or otherwise communicated to the network element.

The memory 60 may also include other information that may be useful for the network element while engaging in communications on the network. For example, the memory may contain a protocol stack 64 containing data and instructions configured to enable the network element to engage in protocol exchanges on the network. Additionally, the memory may contain routing software and routing tables to enable the network element to make routing decisions on the network. The invention is not limited to an embodiment having one or more of these additional features.

A control interface 68 may be provided to set parameters on the antennas. For example, the control interface may contain information relating to the antenna codes 70 and pass that information to the antennas to enable the antennas or controllers associated with the antennas to properly encode the information to be transmitted and information received on the network. Alternatively, the encoding may be performed by the processor 50. The invention is not limited by where, within the network element, the codes are used to encode or decode communications on the network.

The control interface may also be used to set other parameters on the network. For example, the control interface 68 may include a policy module 72 to enable policy to be set on the network element to control, for example, bandwidth and quality of service aspects of transmissions provided to communication service subscribers. The control interface may also include a filter module 74 to enable filters to be set on the network element to cause particular transmissions or types of transmissions to be blocked by the network element.

The policy and filter modules may be contained within the control interface 68, or optionally may be external modules interfaced to the processor 50. Additionally, other modules may be contained within the control interface or otherwise interfaced to the processor. For example, the network element may include a security module 76 interfaced to the processor 50 and configured to authenticate users, devices, or connections on the network, determine appropriate authorization control information to prevent unauthorized access to the network, and enable accounting entries to be established for communication sessions on the network. Other modules may be included as well and the invention is not limited to a particular implementation of the network device.

The functions described above may be implemented as a set of program instructions that are stored in a computer readable memory within the network element and executed on one or more processors within the network element. However, it will be apparent to a skilled artisan that all logic described herein can be embodied using discrete components, integrated circuitry such as an Application Specific Integrated Circuit (ASIC), programmable logic used in conjunction with a programmable logic device such as a Field Programmable Gate Array (FPGA) or microprocessor, a state machine, or any other device including any combination thereof. Programmable logic can be fixed temporarily or permanently in a tangible medium such as a read-only memory chip, a computer memory, a disk, or other storage medium. Programmable logic can also be fixed in a computer data signal embodied in a carrier wave, allowing the programmable logic to be transmitted over an interface such as a computer bus or communication network. All such embodiments are intended to fall within the scope of the present invention.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of designing low-density parity check codes, the method comprising the steps of:
    creating a π-rotation parity check matrix having a first code rate; and
    concatenating a first matrix to the π-rotation parity check matrix to increase the first code rate; and
    storing the concatenated first matrix and π-rotation parity check matrix in a computer usable format.

2. The method of claim 1, further comprising the step of iteratively concatenating additional matrices to the concatenation of the first matrix and the π-rotation parity check matrix to further increase the first code rate.

3. The method of claim 1, wherein the first matrix is formed by the steps of:
    generating a plurality of matrices;
    encoding the matrices with information vectors of weights 1 and 2; and
    discarding matrices with a low minimum distance.

4. The method of claim 3, wherein the first matrix is formed by the additional steps of:
    calculating the approximate upper bound for matrices not discarded; and
    selecting a small set of codes with advantageous characteristics under high signal to noise ratio.

5. The method of claim 4, wherein the advantageous characteristics comprise a lowest bound characteristic.

6. The method of claim 3, wherein the first matrix is formed by the additional steps of:
    calculating girth distributions for the matrices; and
    selecting one of the matrices with a minimum number of short cycles.

7. The method of claim 4, wherein the first matrix is formed by the additional steps of:
    calculating girth distributions for the matrices; and
    selecting one of the matrices with a minimum number of short cycles.

8. The method of claim 1, wherein the first matrix is formed by the steps of:
    generating a plurality of matrices; and
    selecting the first matrix based on expansion properties of the first matrix.

9. The method of claim 8, wherein the step of selecting the first matrix based on expansion properties of the first matrix comprises:
    generating a plurality of matrices having good minimum distance profiles;
    expanding the matrices to create a set of expanded matrices for a predetermined range; and
    selecting one of the matrices as the first matrix based on performance qualifies of the corresponding expanded matrix.

10. The method of claim 9, further comprising determining an error probability of the expanded matrices for high signal to noise ratio.

11. A network element, comprising:
    a processor,
    at least one interface configured to engage in transmissions on a communication network; and;
    control logic configured to create a parity check matrix for use by the interface to perform forward error correction on the transmissions on the communication network, the parity check matrix comprising a π-rotation parity check matrix having a first code rate; and a first matrix concatenated to the π-rotation parity check matrix to increase the first code rate of the π-rotation parity check matrix.

12. The network element of claim 11, wherein the parity check matrix further comprises additional concatenations of additional matrices configured to further increase the first code rate of the concatenation of the first matrix and the π-rotation parity check matrix.

13. The network element of claim 11, further comprising code generation software to generate the parity check code for use by the interface.

14. The network element of claim 11, wherein the interface is an antenna configured to perform one of transmission and reception of wireless signals on a wireless communication network.

15. The network element of claim 11, further comprising routing software to enable the network element to implement routing decisions on the communication network.

* * * * *